(12) United States Patent
Hudgens et al.

(10) Patent No.: US 6,969,869 B2
(45) Date of Patent: *Nov. 29, 2005

(54) PROGRAMMABLE RESISTANCE MEMORY ELEMENT WITH INDIRECT HEATING

(75) Inventors: Steve Hudgens, Santa Clara, CA (US); John D. Davis, Manassas, VA (US); Thomas J. McIntyre, Nokesville, VA (US); John C. Rodgers, Fairfax, VA (US); Keith K. Sturcken, Nokesville, VA (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/655,975

(22) Filed: Sep. 5, 2003

(65) Prior Publication Data

US 2004/0140523 A1 Jul. 22, 2004

Related U.S. Application Data

(60) Continuation-in-part of application No. 10/180,645, filed on Jun. 26, 2002, now Pat. No. 6,692,994, which is a division of application No. 09/943,178, filed on Aug. 30, 2001, now Pat. No. 6,448,576.

(51) Int. Cl.$^7$ .............................................. H01L 29/04
(52) U.S. Cl. ........................ 257/50; 257/529; 438/132; 438/601
(58) Field of Search ........................... 257/50, 529, 530, 257/209; 438/600, 601, 131, 132

(56) References Cited

U.S. PATENT DOCUMENTS

| | | | | |
|---|---|---|---|---|
| 4,814,853 | A | * | 3/1989 | Uchida ........................ 257/530 |
| 5,210,598 | A | * | 5/1993 | Nakazaki et al. ........... 257/530 |
| 6,284,643 | B1 | * | 9/2001 | Reinberg ..................... 438/622 |
| 6,448,576 | B1 | * | 9/2002 | Davis et al. .................. 257/50 |
| 6,692,994 | B2 | * | 2/2004 | Davis et al. ................. 438/128 |

* cited by examiner

*Primary Examiner*—Christian D. Wilson
(74) *Attorney, Agent, or Firm*—Philip H. Schlazer; Marvin S. Siskind

(57) ABSTRACT

The semiconductor device comprising a chalcogenide phase change material. The chalcogenide material being programmed from one resistance state to another resistance state by applying a programming current to a resistor which is in thermal contact with the chalcogenide material. The semiconductor device may be used as memory element or as a programmable fuse.

8 Claims, 7 Drawing Sheets

PROGRAMMABLE RESISTANCE MEMORY ELEMENT WITH INDIRECT HEATING

RELATED APPLICATION INFORMATION

The application is a continuation-in-part of U.S. patent application Ser. No. 10/180,645, filed on Jun. 26, 2002 now U.S. Pat. No. 6,692,994, which is a divisional application of U.S. patent application Ser. No. 09/943,178, filed on Aug. 30, 2001, now U.S. Pat. No. 6,448,576. U.S. patent application Ser. No. 10/180,645 is hereby incorporated by reference herein.

FIELD OF THE INVENTION

The present invention relates generally to semiconductor devices using programmable resistance materials. More specifically, the present invention relates to programmable resistance memory using phase-change materials.

BACKGROUND OF THE INVENTION

The use of programmable phase-change materials (for example, materials which can be programmed between amorphous and crystalline states) for electronic memory applications is well known in the art and is disclosed, for example, in commonly assigned U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated by reference herein.

Generally, phase-change materials are capable of being programmed between a first structural state where the material is generally amorphous and a second structural state where the material is generally crystalline. The term "amorphous", as used herein, refers to a condition which is relatively structurally less ordered or more disordered than a single crystal. The term "crystalline", as used herein, refers to a condition which is relatively structurally more ordered than amorphous. A phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

FIG. 1 is an example of an programmable phase-change memory element. The memory element shown in FIG. 1 includes a substrate 2, a first contact 3 formed over the substrate 2, a chalcogenide phase-change material 5 formed over the first contact 3 and over dielectric 4, and a second contact 6 formed over the chalcogenide memory material 5. The memory element shown in FIG. 1 may be programmed between a plurality of resistance states by applying an appropriate current through the memory material. FIG. 2 is an example of a programmed plot of the resistance of a chalcogenide phase-change memory element versus the amplitude of a current pulse through the memory element.

Referring to FIG. 2, several different programming regimes can be distinguished. In the left side of the curve, the resistance of the device remains substantially constant (i.e., in its high resistance or RESET state) until a current pulse of sufficient energy is applied. The device is then transformed from its high resistance (RESET) state to its low resistance (SET) state. A current pulse sufficient to program the memory element from the high resistance state to the low resistance state is referred to as a "set pulse". While not wishing to be bound by theory, it is believed that the set pulse is sufficient to change at least a portion of the volume of memory material from a less-ordered amorphous state to a more-ordered crystalline state.

The memory device may be programmed back from the low resistance state or SET state to the high resistance or RESET state by applying a current pulse of sufficient amplitude, referred to as a "reset pulse". While not wishing to be bound by theory, it is believed that application of a reset pulse to the memory element is sufficient to change at least a portion of the volume of memory material from a more-ordered crystalline state to a less-ordered amorphous state. The memory device may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 2, as the amplitude of the current through the memory element increases, the resistance of the device increases. This increase is both gradual and reversible. In this regime, the phase-change memory element may be programmed to any resistance value within a window of resistance values bounded by the low resistance or SET state and the high resistance or RESET state. In this regime along the right side of the curve, the phase-change memory element may be programmed from any one of the resistance states on the right side of the resistance curve to any other of the resistance states on the right side of the curve by the application of a current pulse of sufficient amplitude. The device may thus be programmed between three or more resistance values within the resistance window so as to provide for multi-state, directly overwritable data storage. While not wishing to be bound by theory, it is believed that each of the resistance states along the right side of the curve may correspond to a particular ratio of the volume of crystalline material to the volume of amorphous material in an active region of the phase-change material. Three intermediate resistance states R1, R2 and R3 are shown in the resistance curve of FIG. 2.

In the example of the memory element shown in FIG. 1, the programming current is directed from one contact to another through the memory material. Hence, it is possible that relatively high current densities pass through the memory material causing electromigration within the body of chalcogenide and reducing the cycle life of the memory element. Hence, a new device structure is needed which will permit the memory element to be programmed without introducing electrical current into the chalcogenide material.

SUMMARY OF THE INVENTION

One aspect of the present invention is a semiconductor device, comprising: a resistor; and a chalcogenide material thermally coupled to the resistor to permit heat transfer therebetween, the chalcogenide material being programmable between a first resistance state and a second resistance by supplying a current to the resistor to heat the resistor, substantially none of the current entering the chalcogenide material.

Another aspect of the present invention is a semiconductor device, comprising: a programmable resistance material programmable between a plurality of resistance states; a first energy source supplying an electrical energy to the memory material to read the resistance state of the programmable resistance material; and a second energy source supplying a second energy to the programmable resistance material, the second energy causing the programmable resistance material to be heated so as to program the material from one of the resistance states to another of the resistance states without causing substantially any electrical current to enter the memory material.

Another aspect of the invention is a method of programming a semiconductor device, the semiconductor device including a chalcogenide material programmable between a plurality of resistance states, the method comprising: applying an electrical current to the device; and converting at least a portion of the electrical current to heat energy, at least a portion of the heat energy programming the device from one of the resistance states to another of the resistance states, substantially none of the applied electrical current entering the chalcogenide material.

DETAILED DESCRIPTION OF THE INVENTION

The present invention is illustrated with a complementary-metal-oxide semiconductor (CMOS) processing method, though other types of processing technology may also be applicable.

Figure 1:
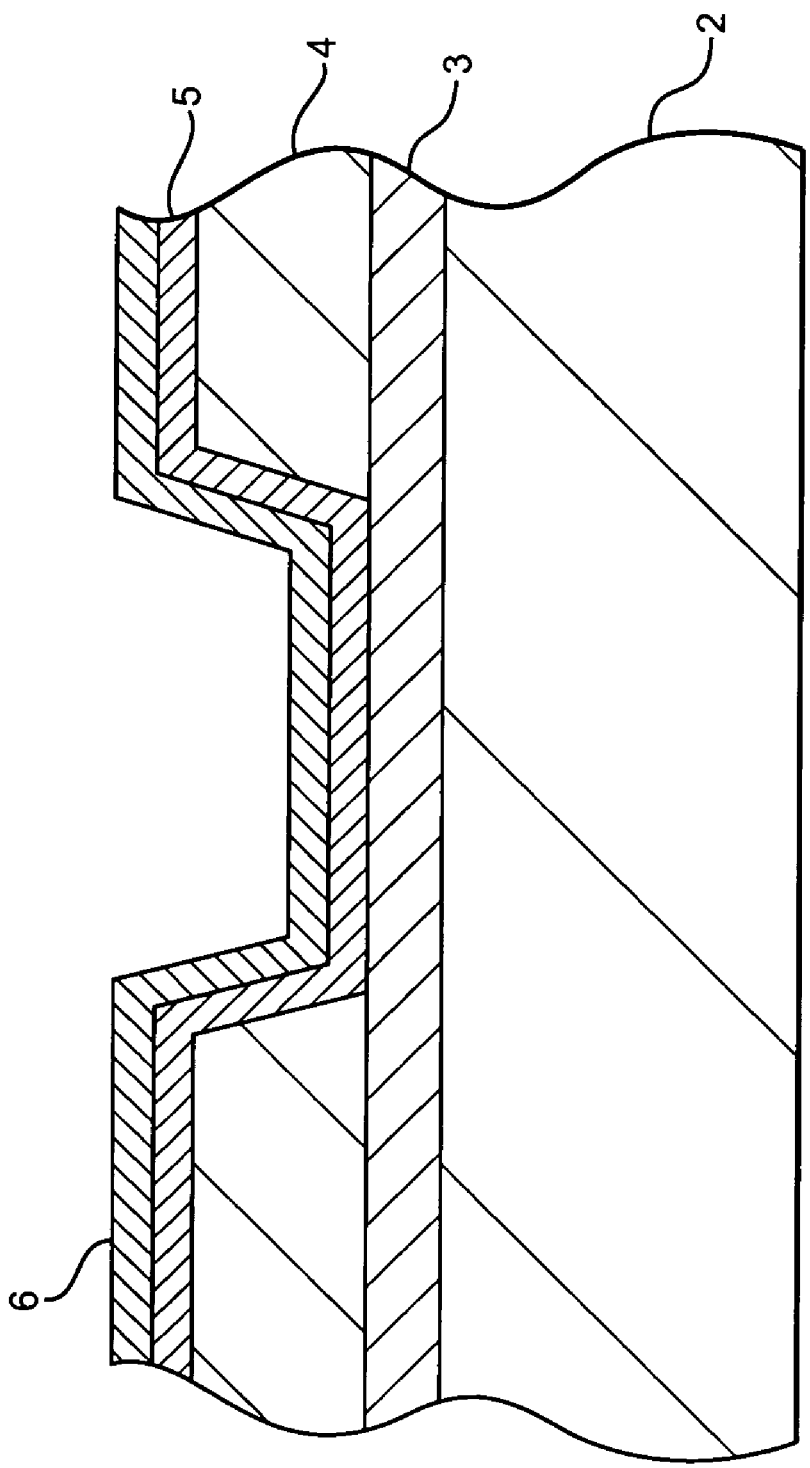
FIG. 1 is an example of a chalcogenide phase-change memory element wherein the programming current is directed through the memory material.
Figure 2:
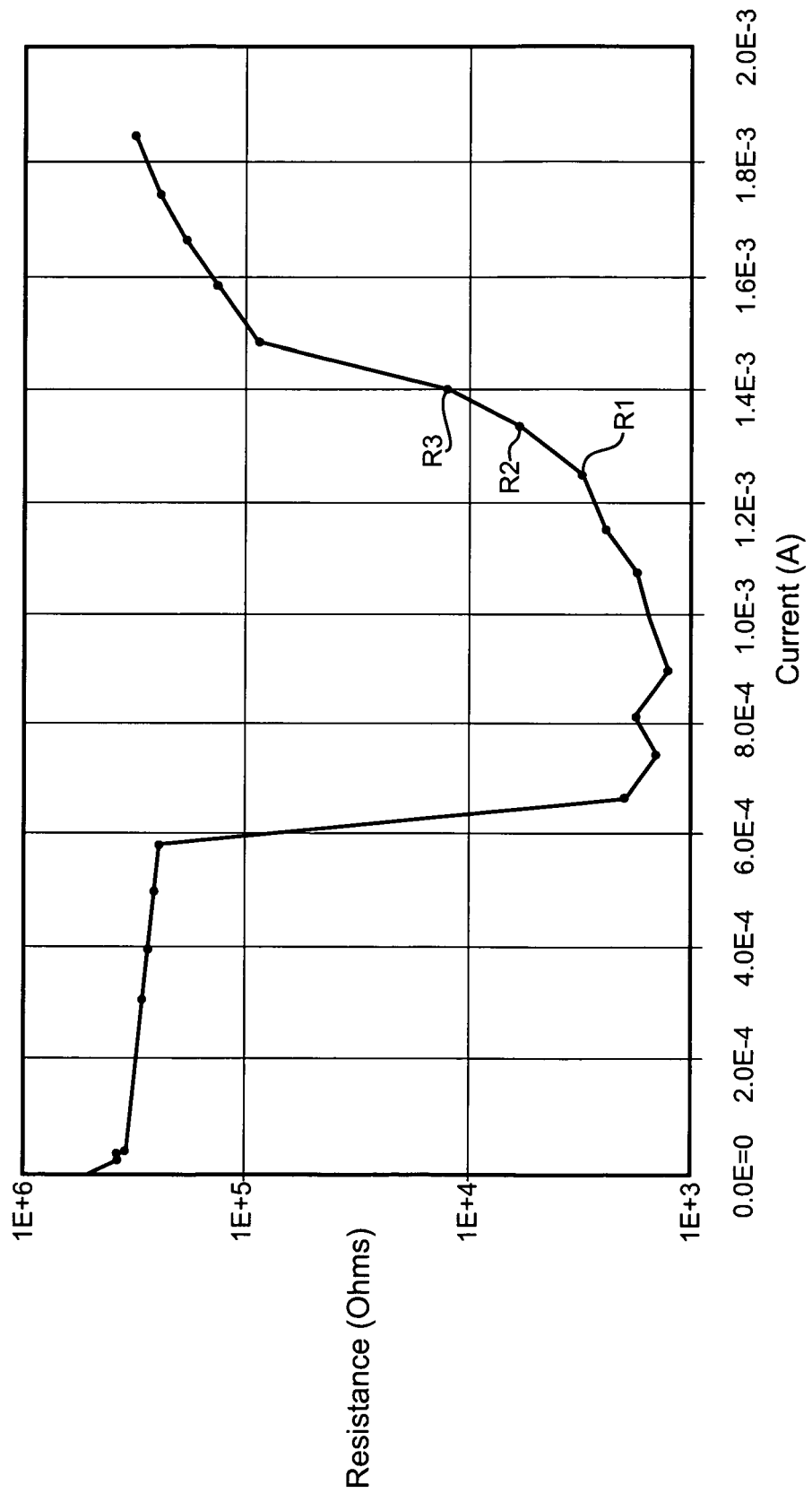
FIG. 2 is an example of a resistance plot of a chalcogenide phase-change memory element as a function of the programming current through the memory material.
Figure 3A:
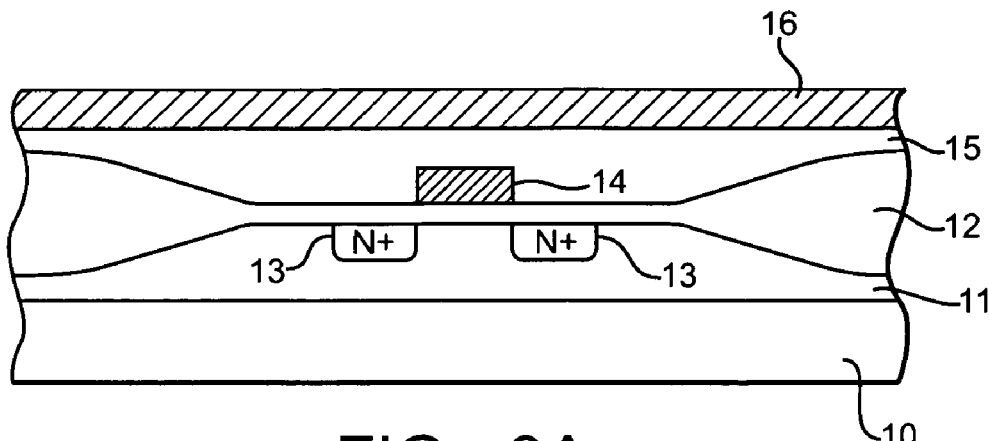
FIGS. 3a–3h are pictorial representations of a process for manufacturing a programmable chalcogenide memory element, in accordance with an embodiment of the present invention.

Referring now to the drawings and in particular to FIGS. 3a–3h, there are illustrated pictorial representations of a process for fabricating a programmable chalcogenide memory element within an integrated circuit, in accordance with a preferred embodiment of the present invention. The process begins with a silicon wafer having an optional epitaxial layer on which active devices can be built. As shown in FIG. 3a, a silicon substrate 10 includes an optional epitaxial layer 11. A silicon dioxide ($SiO_2$) layer 12 having multiple local oxidations of silicon (LOCOS) isolations or shallow trench isolations (STI) may be utilized to isolate one active device from another. In this example, the active device is a transistor formed by n-type diffusions 13 and a polysilicon gate 14. The transistor is covered by a planarized passivation layer 15.

A layer 16 is then deposited on top of the passivation layer 15. The layer 16 may be formed of a conductive material. Examples of conductive materials which may be used include titanium-tungsten, tungsten, tungsten silicide, molybdenum, titanium nitride, titanium carbon-nitride, titanium aluminum-nitride, titanium silicon-nitride, and carbon. Other examples of conductive materials include n-type doped polysilicon, p-type doped polysilicon, p-type doped silicon carbon alloys and/or compounds, n-type doped silicon carbon alloys.

Alternately, the layer 16 may initially be formed from a material that still needs to be altered to change its resistivity. For example, the layer 16 may be formed from undoped polysilicon (that is, the layer 16 may be deposited as an undoped polysilicon). The undoped polysilicon may then be doped with boron to form a p-polysilicon region. Alternately, the undoped polysilicon may be doped with a material such as phosphorous or arsenic to form an n-polysilicon region. The polysilicon material 16 is preferably given a low dose implant, such as an arsenic implant at $4.6 \times 10^{14}/cm^2$ at 100 KeV, to make the polysilicon relatively resistive.

Figure 3B:
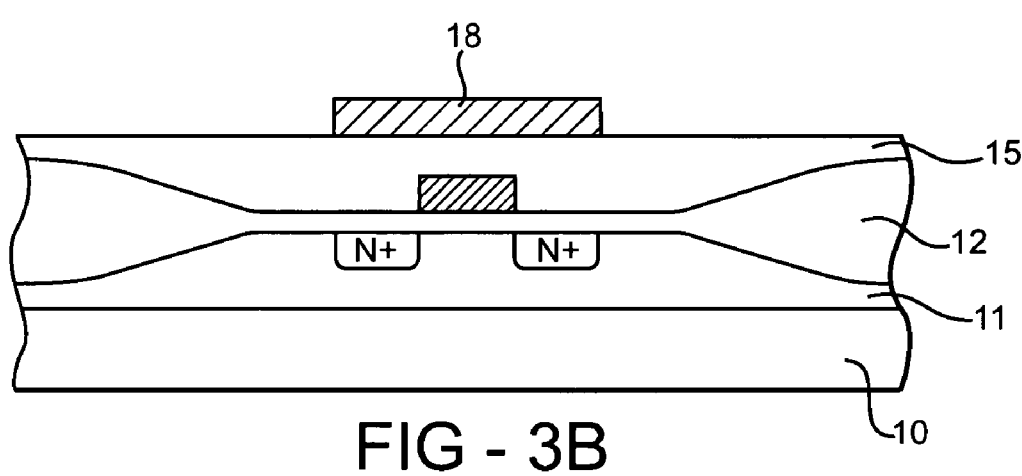

Next, a layer of photoresist is spun on and patterned to define etching areas for layer 16, as it is well-known to those skilled in the art. Layer 16 is then appropriately etched. The etching process used may be a reactive ion etching (RIE) process. The unetched portions of layer 16 becomes resistor 18 as depicted in FIG. 3b.

Optionally, a layer 19 of a dielectric material may be formed over the resistor 18. The dielectric material of layer 19 may be formed of an oxide (such a silicon dioxide) or a nitride (such as a silicon nitride). If the resistor 18 is formed of a doped polysilicon, then an oxide layer may be formed by exposing the resistor to an oxidizing ambient, such as a chamber filled with oxygen gas, in order to grow an oxide layer on top of resistor 18. Specifically, substrate 10 is placed in an oxide tube and resistor 18 is heated to allow a shell of $SiO_2$ (i.e., oxide layer 19) to be grown on top of resistor 18.

Figure 3C:
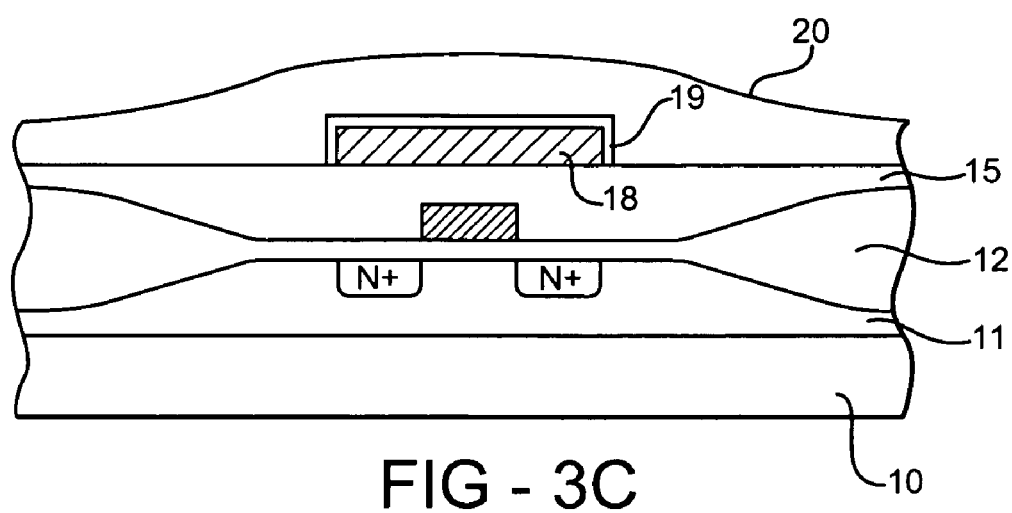

Next, a chalcogenide layer 20 of preferably 0.5 um thick is deposited over passivation layer 15, covering dielectric layer 19 and resistor 18, as shown in FIG. 3c. As noted above, a chalcogenide is a phase-change alloy that is well-known in the art. Dielectric layer 19 acts as a dielectric isolation between resistor 18 and chalcogenide layer 20.

Figure 3D:
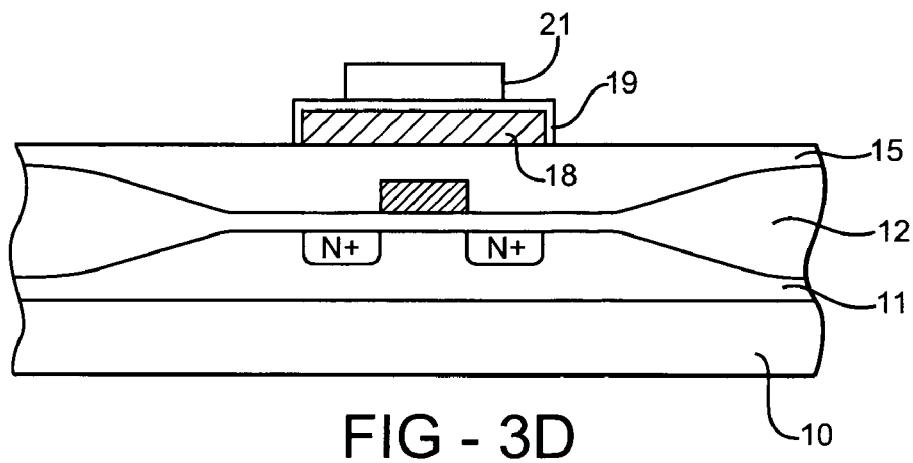

A layer of photoresist is spun on and patterned to define etching areas for chalcogenide layer 20, as it is well-known to those skilled in the art. Chalcogenide layer 20 is then etched via a RIE process. Referring to FIG. 3d, the unetched portions of chalcogenide layer 20 forms a region 21 of chalcogenide material that serves as the memory material for the memory element. A top view of chalcogenide material 21, dielectric layer 19, and resistor 18 (in dashed lines) is illustrated FIG. 3e. Afterwards, a passivation layer 24 is deposited, patterned, and etched to provide openings for the electrical contacts as shown in FIG. 3f.

Electrical contacts 23a,23b are then formed which may be used to provide an electrical current to the chalcogenide material 21. The electrical current provided by the contacts 23a,23b may be used to read the state of the chalcogenide memory element. A thin film of titanium (Ti) followed by a thin film of titanium nitride (TiN) are deposited to form a Ti/TiN adhesion layer 22 that is part of contacts 23a,23b. Ti/TiN adhesion layer 22 is preferably 0.08 um thick. Tungsten layer 30 (also part of contacts 23a, 23b) is then deposited to fill the openings in the passivation layer 24. Tungsten layer 30 is subsequently isolated using a chemical-mechanical polishing (CMP) process to form tungsten plugs within contacts 23a,23b.

Next, a layer of a conductive material, preferably 0.5 um, is deposited on top of passivation layer 24, and tungsten plugs. The conductive material is then etched to form conductive layers 27a, 27b. The conductive layers 27a, 27b are electrically coupled to the contacts 23a,23b. The conductive layers 27a, 27b may be formed of a metal such as aluminum or copper.

Figure 3E:
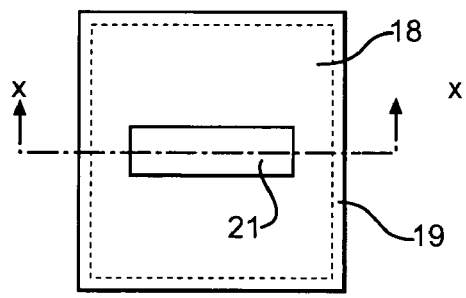
Figure 3F:
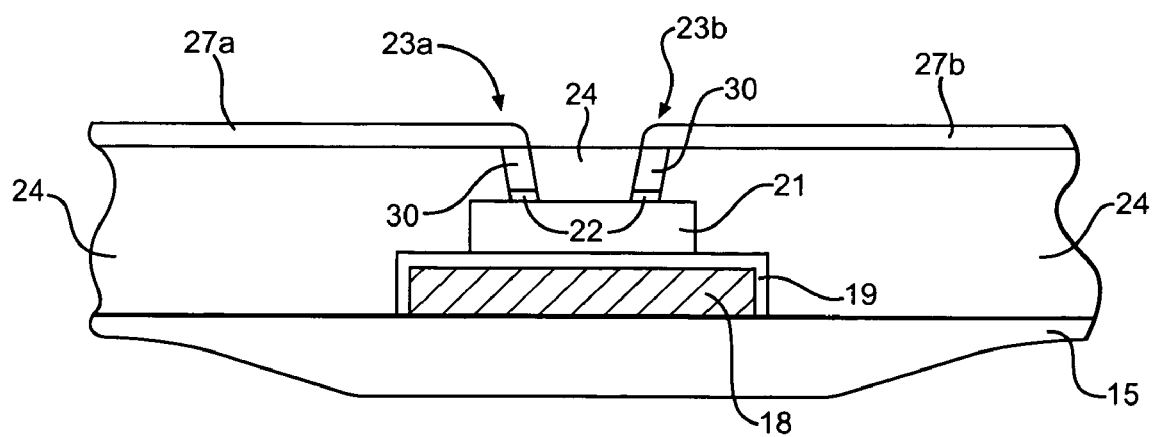

FIG. 3f is a cross-section view of resistor 18, chalcogenide material 21, Ti/TiN adhesion layer 22, passivation layer 24, tungsten layer 30, and the conductive layers 27a, 27b along line X—X of FIG. 3e.

Figure 3G:
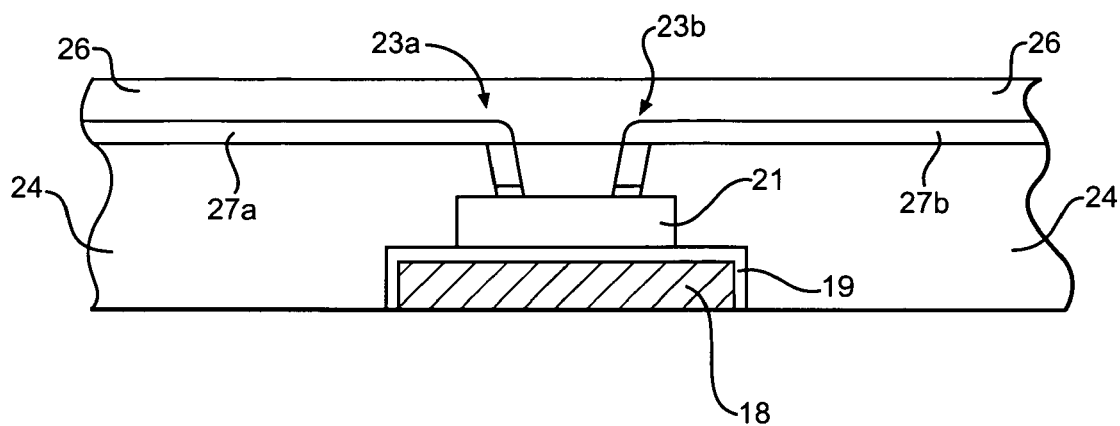
Figure 3H:
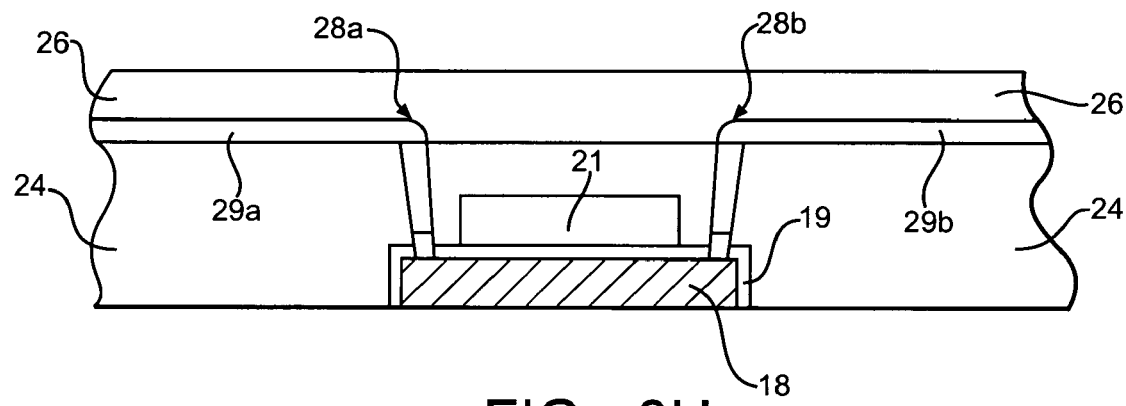

Next, the silicon wafer is annealed. A passivation layer 26 is then deposited on top of conductive layers 27a, 27b, as depicted in FIG. 3g. The programmable resistance memory element is now complete with resistor 18 that can heat the programmable chalcogenide material 21 to activate a phase change. Chalcogenide material 21 may be heated by sending a current through resistor 18. FIG. 3h is a cross-sectional view of the chalcogenide memory element of FIG. 3g in a direction perpendicular to that of FIG. 3g. Similar to FIG. 3g, FIG. 3h illustrates contacts 28a and 28b being electrically coupled to resistor 18 such that current may be sent through resistor 18 to heat the chalcogenide material 21. Conductive layers 29a, 29b are electrically coupled to contacts 28a, 28b respectively. Conductive layers 29a, 29b may be formed of a metal such as aluminum or copper.

Figure 4:
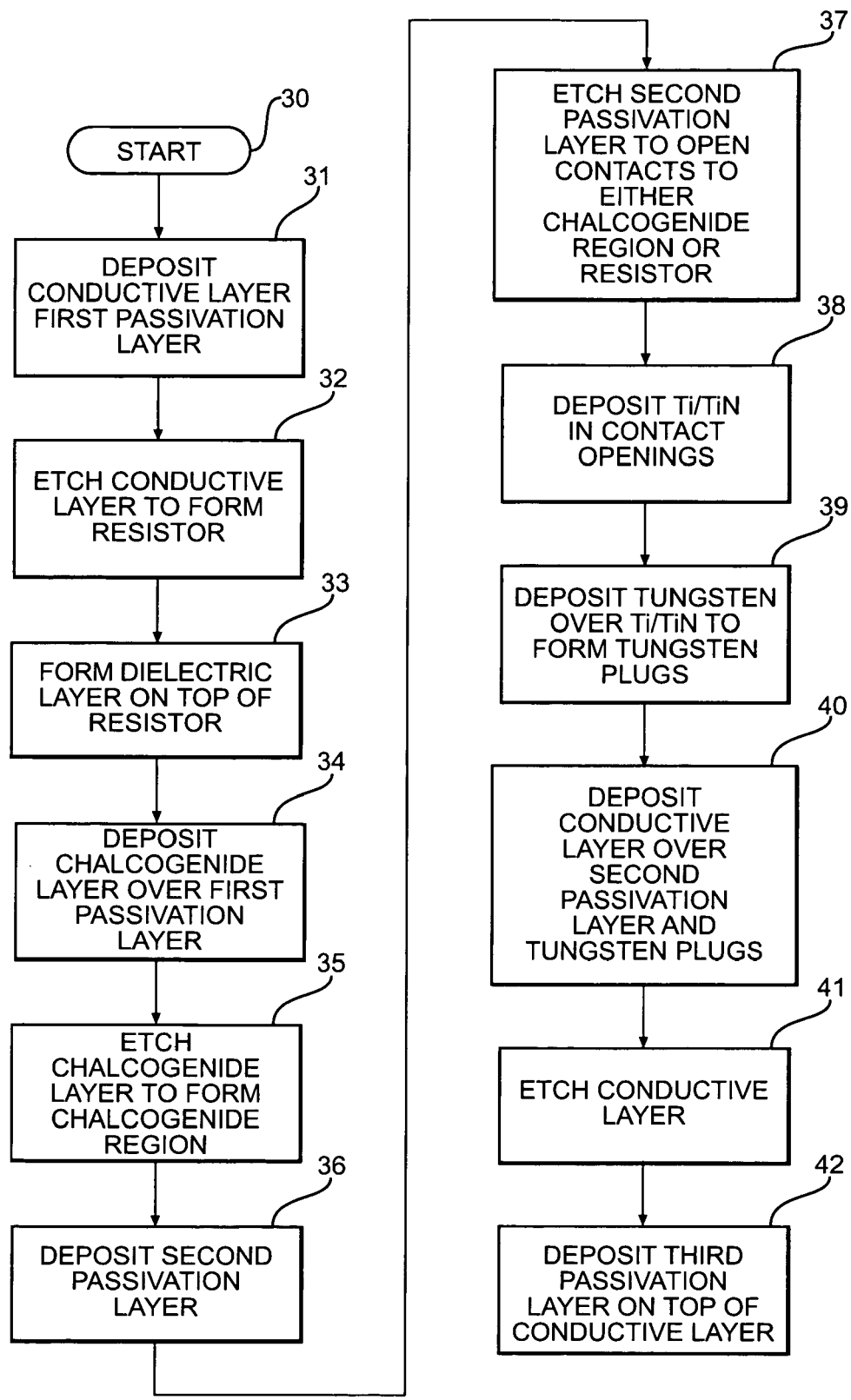
FIG. 4 is a high-level process flow diagram of a method for manufacturing the programmable chalcogenide memory element from FIGS. 3a–3h, in accordance with an embodiment of the present invention.

With reference now to FIG. 4, there is illustrated a high-level process flow diagram of a method for manufacturing the programmable resistance memory element from FIGS. 3a–3h, in accordance with a preferred embodiment of the present invention. Starting at block 30, a conductive layer is deposited on top of a first passivation layer covering various active devices, as shown in block 31. The conductive layer is then etched to form a resistor, as depicted in block 32. A dielectric layer is formed on top of the resistor 18, as illustrated in block 33. Afterwards, a chalcogenide layer is deposited over the first passivation layer, covering the dielectric layer and the resistor, as shown in block 34. The chalcogenide layer is then etched to form a region of chalcogenide memory material, as depicted in block 35. A second passivation layer is deposited, as illustrated in block 36. Next, the second passivation layer is etched to form contact openings to either the chalcogenide memory material and/or resistor, as shown in block 37. Afterwards, a thin film of Ti followed by a thin film of TiN are deposited in the contact openings to form a Ti/TiN adhesion layer within the contact openings, as depicted in block 38. Then, a tungsten layer is deposited over the Ti/TiN adhesion layer to form a tungsten plug within each contact opening, as illustrated in block 39. Next, an conductive layer is deposited over the second passivation layer and the tungsten plugs, as shown in block 40. Specific locations of the conductive layer (which may be formed of a metal such as aluminum or copper) are then etched, as depicted in block 41. Finally, a third passivation layer is deposited on top of the conductive layer, as illustrated in block 42.

As has been described, the present invention provides a method of manufacturing a programmable chalcogenide memory element within a semiconductor device. In an amorphous state, a chalcogenide material, such as chalcogenide memory material 21 has a high electrical resistance, but in a crystalline state, the chalcogenide material has a low electrical resistance. Thus, chalcogenide material 21 can be programmed back and forth between a low resistance state and a high resistance state.

Figure 5:
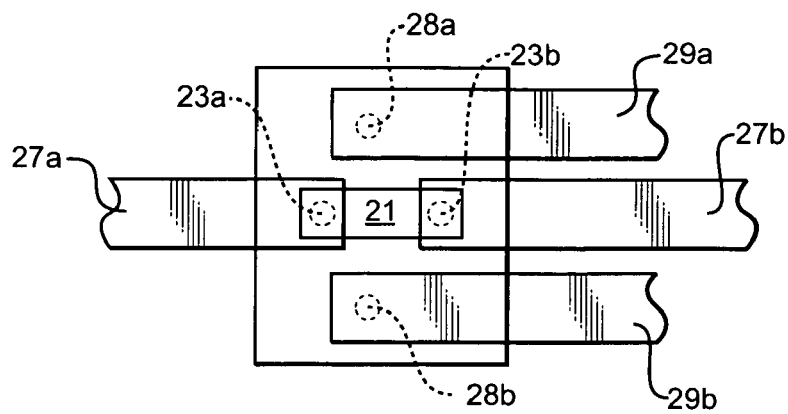
FIG. 5 is a top view of a programmable chalcogenide memory element, in accordance with an embodiment of the present invention.

The chalcogenide material 21 is preferably programmed from one resistance state to another indirectly with heat. Referring now to FIG. 5, there is illustrated a top view of chalcogenide material 21 along with different contacts, in accordance with a preferred embodiment of the present invention.

In order to program the chalcogenide material 21 indirectly, current for programming chalcogenide material 21 can be applied using contacts 28a and 28b. Using contacts 28a and 28b, a programming current is directed through the resistor 18. As electric current moves through the resistor 18, the electric potential energy of the current is transferred as heat energy to the resistor 18. On a microscopic scale this can be understood as collisions between electrons and the material lattice which increases the amplitude of the thermal vibrations of the lattice. This effect is called Joule heating. The rate of transfer of electrical energy to heat energy is directly proportional to the electrical resistivity of the material. Increasing the electrical resistivity of the material increases the rate at which heat energy is formed from electrical energy.

At least a portion of the heat generated by the resistor 18 flows into the chalcogenide material to heat the chalcogenide material. While not wishing to be bound by theory, it is believed that the heat entering the chalcogenide material causes the chalcogenide material to change phase (from amorphous to crystalline or from crystalline to amorphous).

Preferably, substantially none of the programming current that flows from the contact 28a to the contact 28b (and through the resistor 18) flows into the chalcogenide material. The programming current may be prevented from entering the chalcogenide material by the dielectric layer 19 that electrically insulates the resistor 18 from the chalcogenide material 21. As noted above, it is possible that, in another embodiment of the invention, the memory element be made without the dielectric layer 19. In this situation, it is still possible to prevent any of the programming current from entering the chalcogenide material by applying the appropriate voltages to the contacts 28a, 28b and to the contacts 23a, 23b. Hence, the memory element of the present invention may be programmed between different resistance states without substantially any of the programming current actually entering the chalcogenide memory material.

Figure 6:
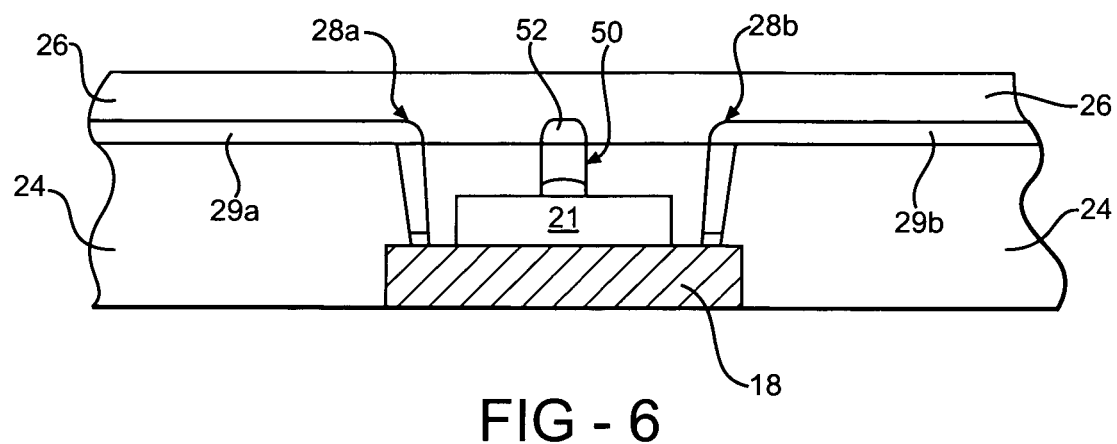
FIG. 6 an embodiment of a programmable chalcogenide memory element of the present invention formed as a three terminal device.

The embodiment of the memory element shown in FIG. 3h is an example of a four contact device. Two contacts 28a,28b are used to supply current to the resistor 19 in order to heat and program the memory material. Two contacts 23a, 23b are used to supply a current to the memory material in order to read the state of the memory element. Another embodiment of a memory element of the present invention is shown in FIG. 6. The device shown in FIG. 6 is a three contact device since it includes only three electrical contacts 28a, 28b and 50. The device shown in FIG. 6 (like the device shown in FIG. 3h) may be programmed by a applying a programming current from contact 28a to contact 28b through resistor 18. When the device is programmed, preferably substantially none of the programming current enters the chalcogenide material. The programming current may be prevented from entering the chalcogenide material by appropriately controlling the voltages applied to the contacts 28a, 28b and 50. The device shown in FIG. 6 may be read by applying an electrical signal to the memory element using contact 50 and one of the contacts 28a, 28b. For example, a known electrical current may be directed through the memory element and the resulting voltage across the contacts may be measured. Alternately, a known electrical voltage may be applied the contacts of the memory element and the current through the memory material may be measured. Conductive layer 52 is electrically coupled to contact 50. Conductive layer 52 may be formed of a metal such as aluminum or copper.

Hence, in the embodiments shown in FIG. 3h and FIG. 6, the memory element is read using an electrical signal. In an alternate embodiment of the invention, it is possible that the memory element be read by directing other forms of energy into the memory material. For example, the memory element may be read optically by directing optical energy into the material and measuring the reflectivity of the material.

Figure 7:
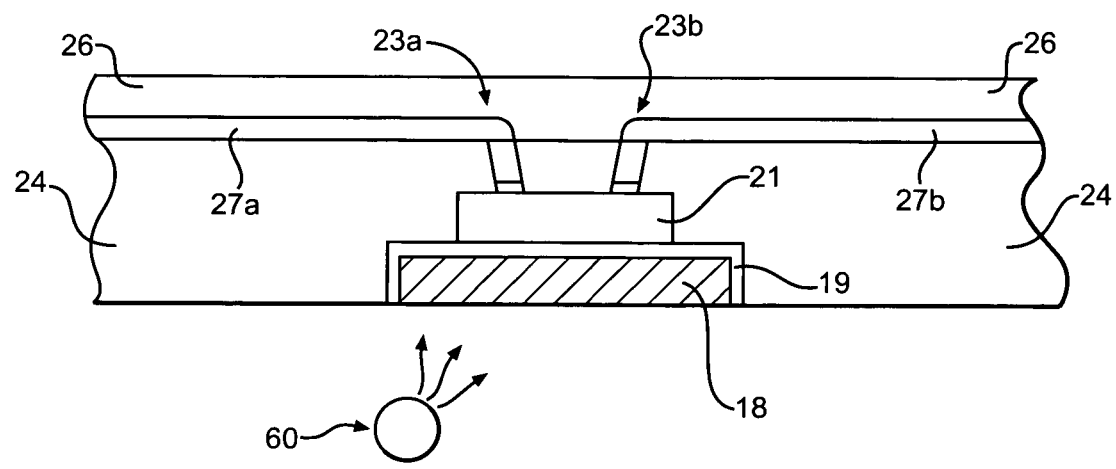
FIG. 7 is an embodiment of a programmable chalcogenide memory element of the present invention using optical energy to heat the memory material.

In the embodiments of the invention shown in FIG. 3h and FIG. 6, a programming current is directed through the resistor 18 to heat the resistor. At least a portion of the heat enters to chalcogenide material to program the material from one resistance state to another while substantially none of the programming current enters the chalcogenide material. In alternate embodiments of the invention it is possible to also program the memory material without passing programming currents through the material by applying other types of energy directly to the material. For example, optical, electromagetic and/or acoustical energy may be applied directly to the memory material. These energies will heat the memory material so that the material can be programmed from one resistance state to another. Due to thermoelectric effects, the heat generated within the material may cause small transient currents to flow within the chalcogenide material (from one part of the chalcogenide material to another part of the chalcogenide material). However, these energies will not cause any substantial electrical currents to pass through the material (that is, currents will preferably not be entering and leaving the material). Hence, like the embodiments shown in FIG. 3h and 6, these embodiments will allow the material to be programmed without passing programming currents through the chalcogenide memory material. FIG. 7 shows an embodiment of the invention whereby the memory material is programmed using optical energy (using a laser 60) but read using electrical energy (applied via contacts 23a, 23b).

In addition to being used as a memory element to store data, the semiconductor device of the present invention may also be used as a fuse. When used as a fuse, the chacogenide material 21 may be used to connect or disconnect two nodes of a circuit. For example, two nodes of a circuit may be coupled to each other through the chalcogenide material (hence, the chalcogenide material may act as an electrical pathway between the two nodes). If the chalcogenide material is programmed to its high resistance state, then two nodes of a circuit would effectively be disconnected since a relatively high resistance pathway would exist between the two nodes. On the other hand, if the chalcogenide material is programmed to its low resistance state, then the two nodes of the circuit will effectively be connected from each other since a relatively low resistance pathway would exist between the two nodes.

In addition, it is noted that failing addresses of a memory array are typically detected and recorded when the memory array is tested by the manufacturer. It is possible that each failing address can be recorded or mapped into a programable fuse matrix on the device. In use, comparative circuitry exists to detect a live address to the addresses mapped in the programmed fuse matrix. When the comparator detects a match, an alternative or redundant circuit is invoked. The data is either written or read in the redundant circuit. By using chalcogenide as the material to make a fuse structure, the fuse can be programmed with normal power levels while the device is being tested. Chalcogenide fuses can also be reprogrammed if a fault develops after manufacturing. On-chip logic could be added so that the detection and replacement of defective rows or columns could be implemented on-chip transparent to a data processing system.

Furthermore, chalcogenide fuses can be incorporated into a chalcogenide based memory array as well as into a bipolar, metal-oxide semiconductor, ferroelectric or other technology memory array or logic devices. Thus, the application of chalcogenide fuses ranges from a simple non-volatile redundancy circuit to a complex, dynamically programmable, defect self detecting and repairing device. It use as a fuse is described in detail in U.S. Pat. No. 6,448,576. The entire disclosure of U.S. Pat. No. 6,448,576 is in corporated by reference herein.

While the invention has been particularly shown and described with reference to a preferred embodiment, it will be understood by those skilled in the art that various changes in form and detail may be made therein without departing from the spirit and scope of the invention.

We claim:

1. A semiconductor device, comprising:

a resistor; and a chalcogenide material thermally coupled to said resistor to permit heat transfer therebetween, said chalcogenide material being programmable between a first resistance state and a second resistance by supplying a current to said resistor to heat said resistor, substantially none of said current entering said chalcogenide material.

2. The semiconductor device of claim 1, wherein said resistor comprises a conductive material.

3. The semiconductor device of claim 1, wherein said resistor comprises at least one material selected from the group consisting of titanium-tungsten, tungsten, tungsten silicide, molybdenum, titanium nitride, titanium carbonnitride, titanium aluminum-nitride, titanium silicon-nitride, carbon, n-type doped polysilicon, p-type doped polysilicon, p-type doped silicon carbon alloys, p-type doped silicon carbon compounds, and n-type doped silicon carbon alloys.

4. A semiconductor device, comprising:

a programmable resistance material programmable between a plurality of resistance states;

a first energy source supplying an electrical energy to said memory material to read the resistance state of said programmable resistance material; and a second energy source supplying a second energy to said programmable resistance material, said second energy causing said programmable resistance material to be heated so as to program said material from one of said resistance states to another of said resistance states without causing substantially any electrical current to enter said memory material.

5. The semiconductor device of claim 4, wherein said second energy is optical energy.

6. The semiconductor device of claim 4, wherein said programmable resistance material is a phase change material.

7. The semiconductor device of claim 4, wherein said programmable resistance material includes a chalcogen element.

8. A method of programming a semiconductor device, said semiconductor device including a chalcogenide material programmable between a plurality of resistance states, said method comprising:

applying an electrical current to said device; and converting at least a portion of said electrical current to heat energy, at least a portion of said heat energy programming said device from one of said resistance states to another of said resistance states, substantially none of said applied electrical current entering said chalcogenide material.

* * * * *